(12) United States Patent
Hibino et al.

(10) Patent No.: US 8,931,168 B2
(45) Date of Patent: Jan. 13, 2015

(54) METHOD FOR MANUFACTURING MULTILAYER PRINTED WIRING BOARD

(75) Inventors: Toshiaki Hibino, Ogaki (JP); Takema Adachi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 478 days.

(21) Appl. No.: 13/430,038

(22) Filed: Mar. 26, 2012

(65) Prior Publication Data

US 2012/0246925 A1 Oct. 4, 2012

Related U.S. Application Data

(60) Provisional application No. 61/469,249, filed on Mar. 30, 2011.

(51) Int. Cl.
| | |
|---|---|
| *H01K 3/30* | (2006.01) |
| *H05K 3/00* | (2006.01) |
| *H05K 3/34* | (2006.01) |
| *H05K 3/42* | (2006.01) |
| *H05K 3/46* | (2006.01) |

(52) U.S. Cl.
CPC ............ *H05K 3/0038* (2013.01); *H05K 3/3478* (2013.01); *H05K 3/422* (2013.01); *H05K 3/4661* (2013.01); *H05K 2201/09563* (2013.01); *H05K 2203/041* (2013.01); *H05K 2203/1572* (2013.01)
USPC .................. 29/852; 29/825; 29/830; 29/832; 29/846

(58) Field of Classification Search
USPC ............................ 29/825, 830, 832, 846, 852
See application file for complete search history.

(56) References Cited

U.S. PATENT DOCUMENTS 3,354,543 A * 11/1967 Lawrence et al. ................ 29/853
5,841,102 A * 11/1998 Noddin ..................... 219/121.71

FOREIGN PATENT DOCUMENTS

| CN | 101925264 A | 12/2010 |
|---|---|---|
| JP | 3-91291 | 4/1991 |
| JP | 2002-76615 | 3/2002 |
| JP | 2006-041463 | 2/2006 |
| JP | 2010-258048 A | 11/2010 |
| JP | 2010-287878 | 12/2010 |
| KR | 1997-0078780 | 12/1997 |
| KR | 10-2010-0132454 | 12/2010 |

OTHER PUBLICATIONS

U.S. Appl. No. 13/427,231, filed Mar. 22, 2012, Hibino, et al.

* cited by examiner

*Primary Examiner* — Carl Arbes
(74) *Attorney, Agent, or Firm* — Oblon, Spivak, McClelland, Maier & Neustadt, L.L.P.

(57) ABSTRACT

A method for manufacturing a printed wiring board includes preparing a core substrate having a first surface and a second surface on the opposite side of the first surface, forming on the first-surface side of the substrate a first opening portion tapering from the first toward second surface, forming on the second-surface side of the substrate a second opening portion tapering from the second toward first surface, forming a third opening portion such that a penetrating hole formed of the first opening portion, the second opening portion and the third opening portion connecting the first and second opening portions is formed in the substrate, forming a first conductor on the first surface of the substrate, forming a second conductor on the second surface of the substrate, and filling a conductive material in the penetrating hole such that a through-hole conductor connecting the first and second conductors is formed.

20 Claims, 12 Drawing Sheets

FIG. 4
(A)
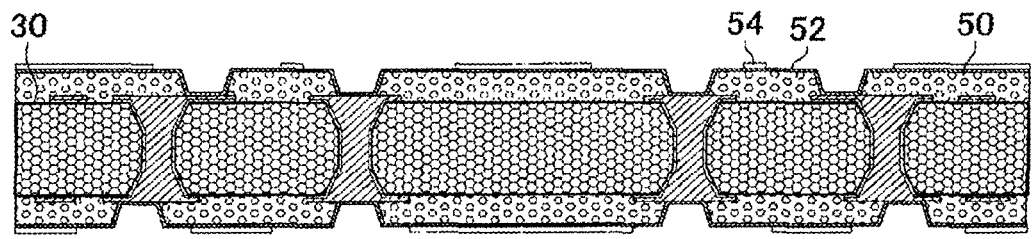
(B)
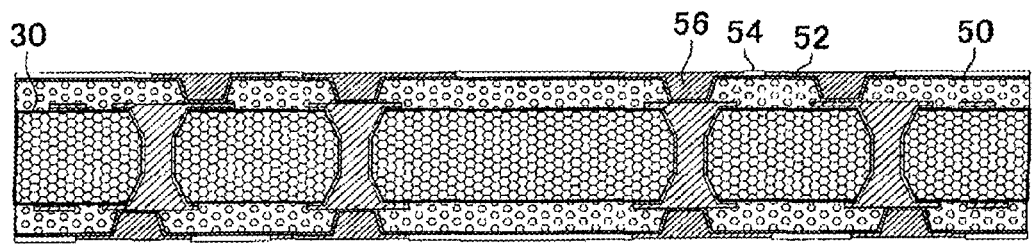
(C)
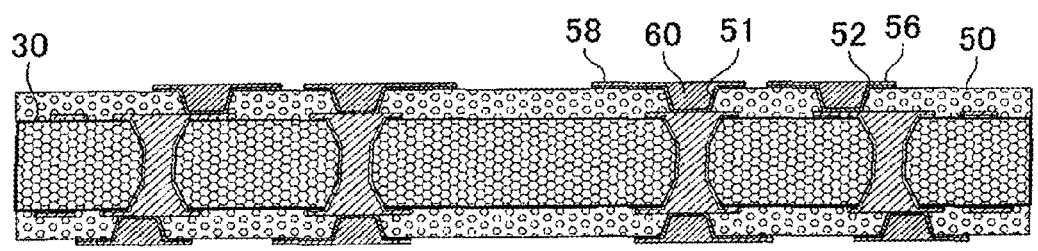

FIG. 5
(A)
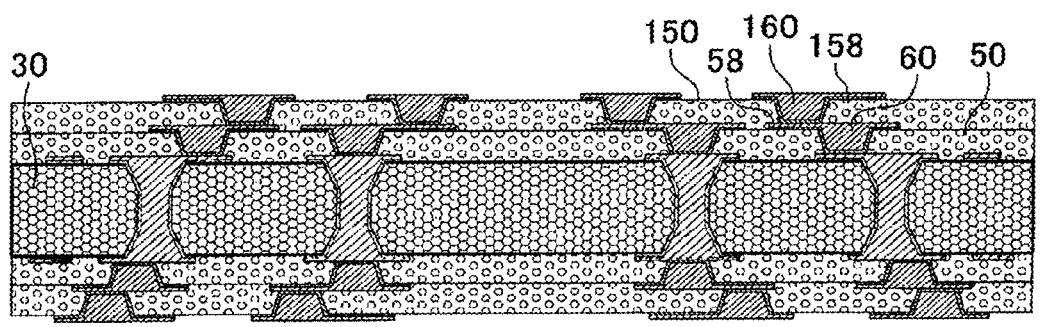
(B)
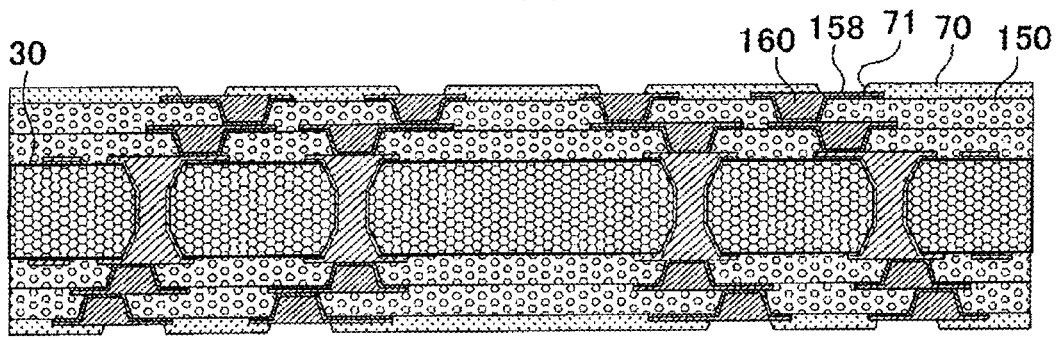
(C)
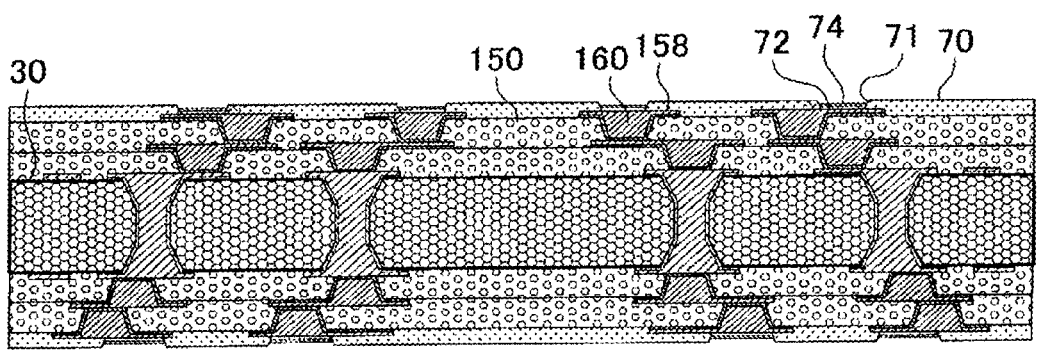

FIG. 13
(A)  Background Art
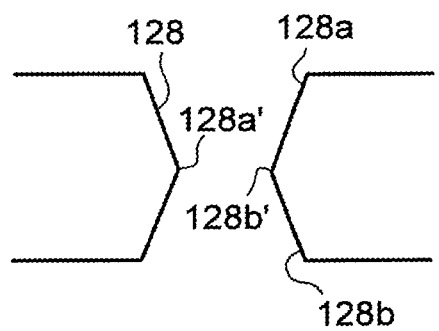
(B)  Background Art
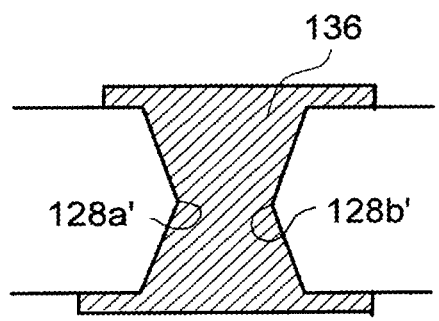

METHOD FOR MANUFACTURING MULTILAYER PRINTED WIRING BOARD

CROSS-REFERENCE TO RELATED APPLICATIONS

The present application is based on and claims the benefit of priority to U.S. Application No. 61/469,249, filed Mar. 30, 2011, the entire contents of which are incorporated herein by reference.

BACKGROUND OF THE INVENTION

1. Field of the Invention

The present invention relates to a method for manufacturing a printed wiring board having conductors formed on upper and lower surfaces of a core substrate and a through-hole conductor formed in a penetrating hole of the core substrate to connect the conductors formed on the upper and lower surfaces.

2. Discussion of the Background

In Japanese Laid-Open Patent Publication 2006-41463, a penetrating hole is formed by using a laser to form a first opening portion from a first-surface side of a core substrate and also using a laser to form a second opening portion from a second-surface side. The first opening portion tapers as it goes toward the second surface, and the second opening portion tapers as it goes toward the first surface. Then, by filling plating in the penetrating hole, a small-diameter through-hole conductor is formed to connect the upper and lower surfaces of the core substrate. FIGS. 13(A), (B) show penetrating hole 128 filled with plating where two tapered opening portions (128a, 128b) are directly connected. As shown in FIG. 13(B), when through-hole conductor 136 is formed by filling plating in penetrating hole 128, where tapered opening portions (28a, 28b) are directly connected, stress tends to be concentrated in one location (128a', 128b') at which the diameter of through-hole conductor 136 reaches its minimum. The entire contents of this publication are incorporated herein by reference.

SUMMARY OF THE INVENTION

According to one aspect of the present invention, a method for manufacturing a printed wiring board includes preparing a core substrate having a first surface and a second surface on the opposite side of the first surface, forming on a first-surface side of the core substrate a first opening portion tapering from the first surface toward the second surface, forming on a second-surface side of the core substrate a second opening portion tapering from the second surface toward the first surface, forming a third opening portion such that a penetrating hole formed of the first opening portion, the second opening portion and the third opening portion connecting the first opening portion and the second opening portion is formed in the core substrate, forming a first conductor on the first surface of the core substrate, forming a second conductor on the second surface of the core substrate, and filling a conductive material in the penetrating hole such that a through-hole conductor connecting the first conductor and the second conductor is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(C) are views of steps showing the method for manufacturing a multilayer printed wiring board according to the first example;

FIGS. 5(A)-5(C) are views of steps showing the method for manufacturing a multilayer printed wiring board according to the first example;

FIGS. 13(A)-13(B) are views to illustrate penetrating holes according to the Background Art.

DETAILED DESCRIPTION OF THE EMBODIMENTS

Figure 1:
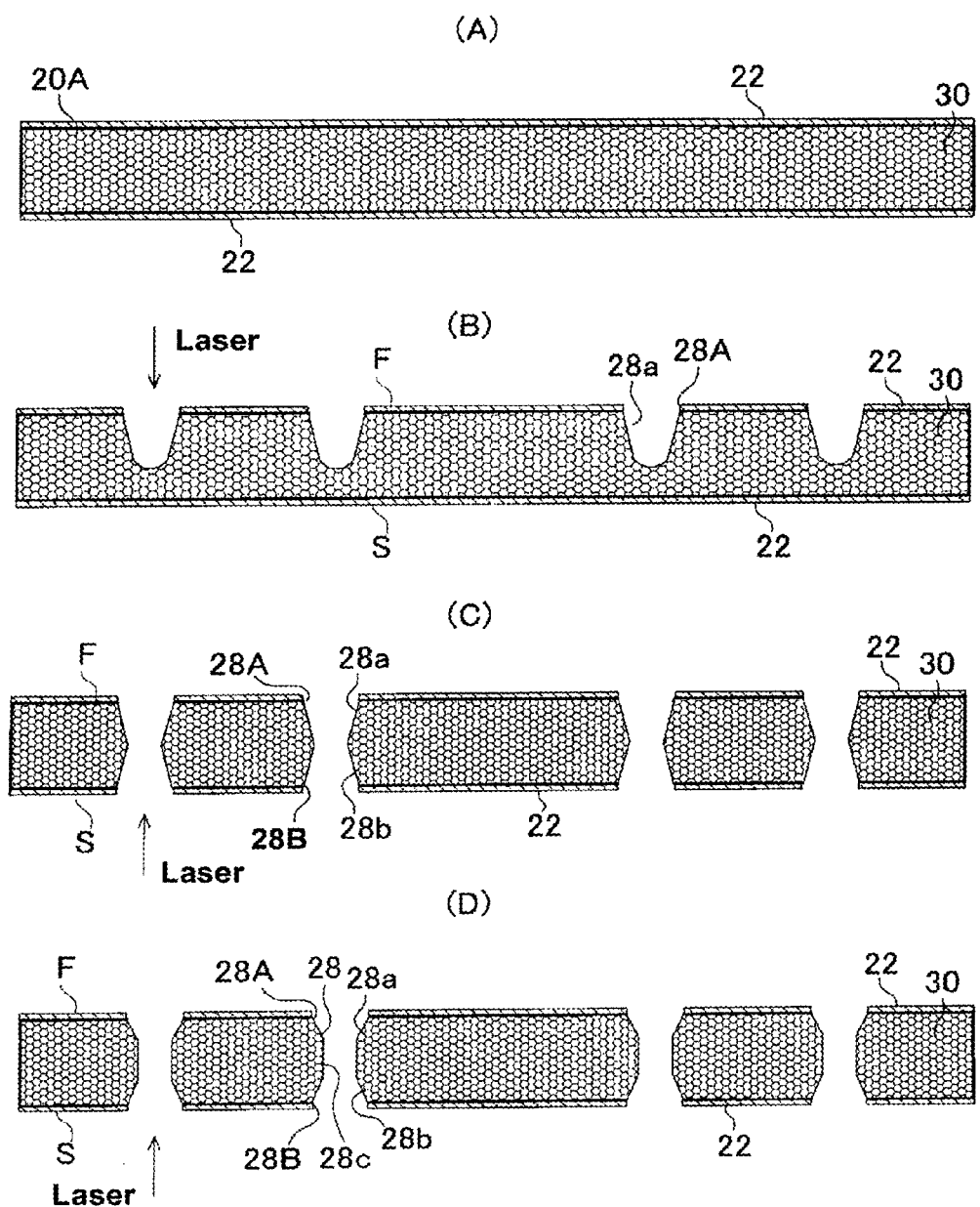
FIGS. 1(A)-1(D) are views of steps showing a method for manufacturing a multilayer printed wiring board according to a first example of the present invention.
Figure 2:
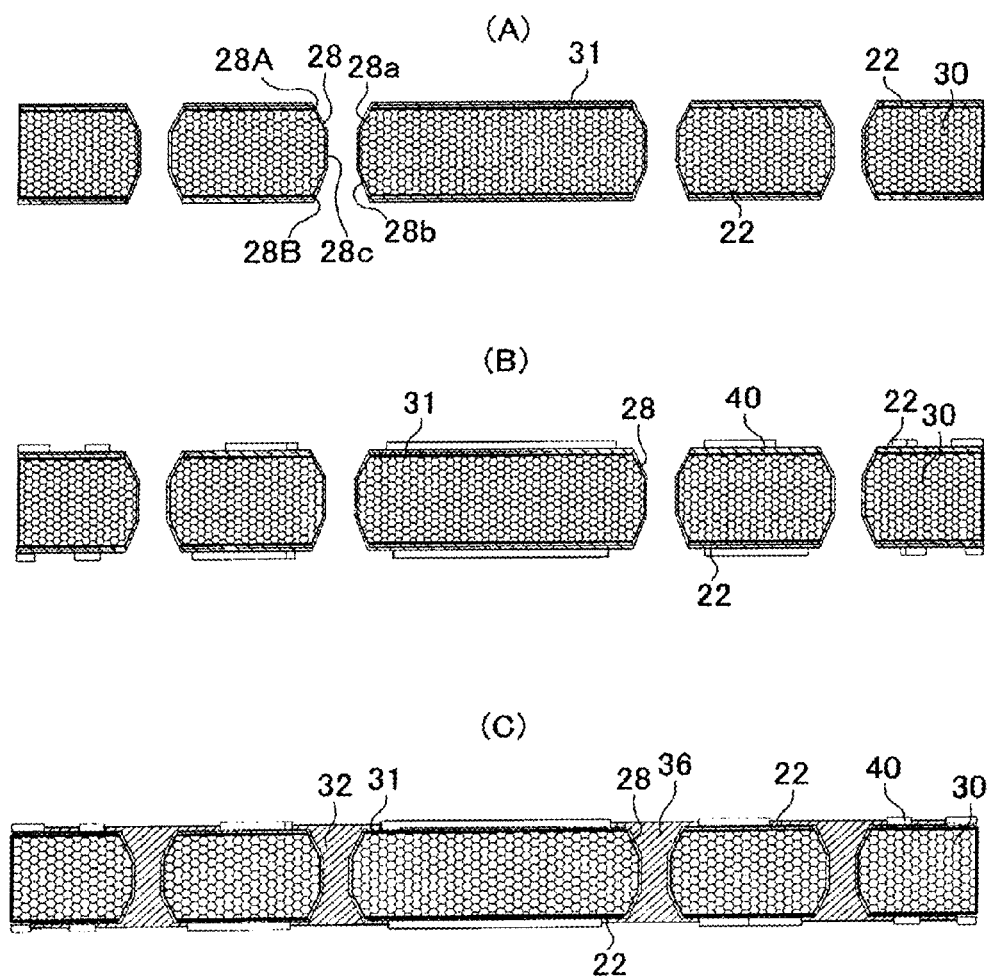
FIGS. 2(A)-2(C) are views of steps showing the method for manufacturing a multilayer printed wiring board according to the first example.
Figure 3:
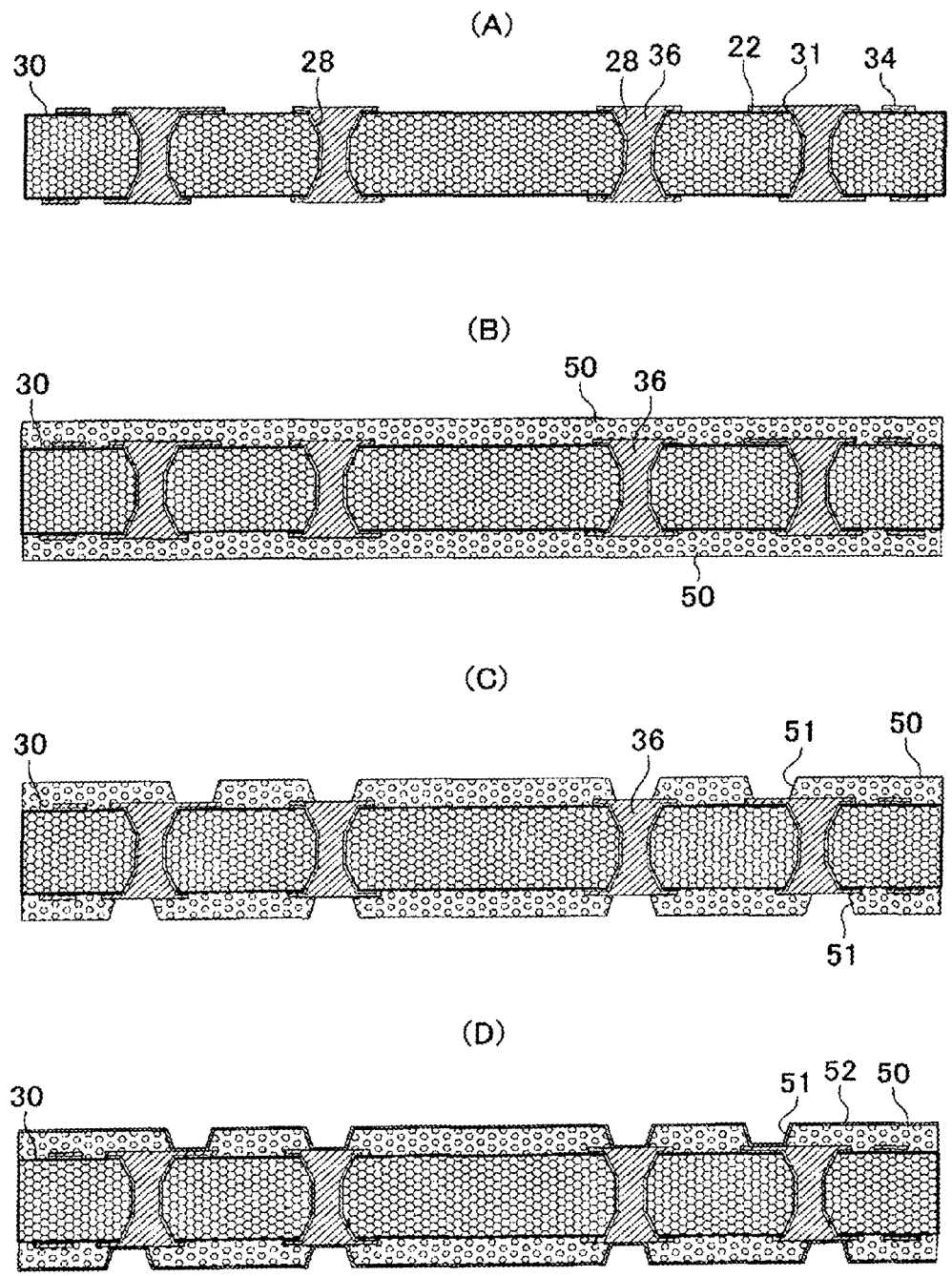
FIGS. 3(A)-3(D) are views of steps showing the method for manufacturing a multilayer printed wiring board according to the first example.

The embodiments will now be described with reference to the accompanying drawings, wherein like reference numerals designate corresponding or identical elements throughout the various drawings.

FIRST EXAMPLE

Figure 6:
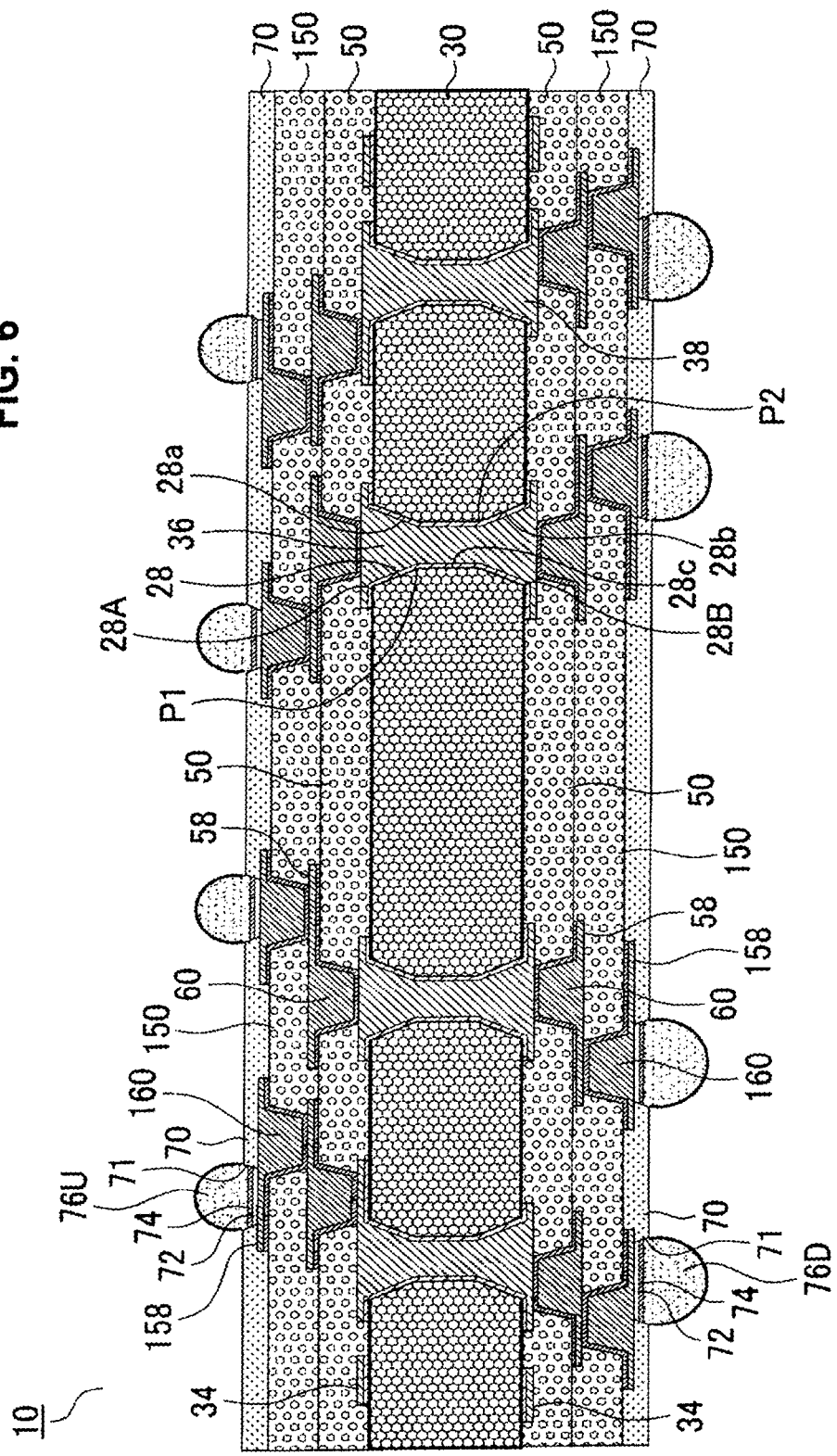
FIG. 6 is a cross-sectional view of a multilayer printed wiring board prior to mounting an IC chip.
Figure 7:
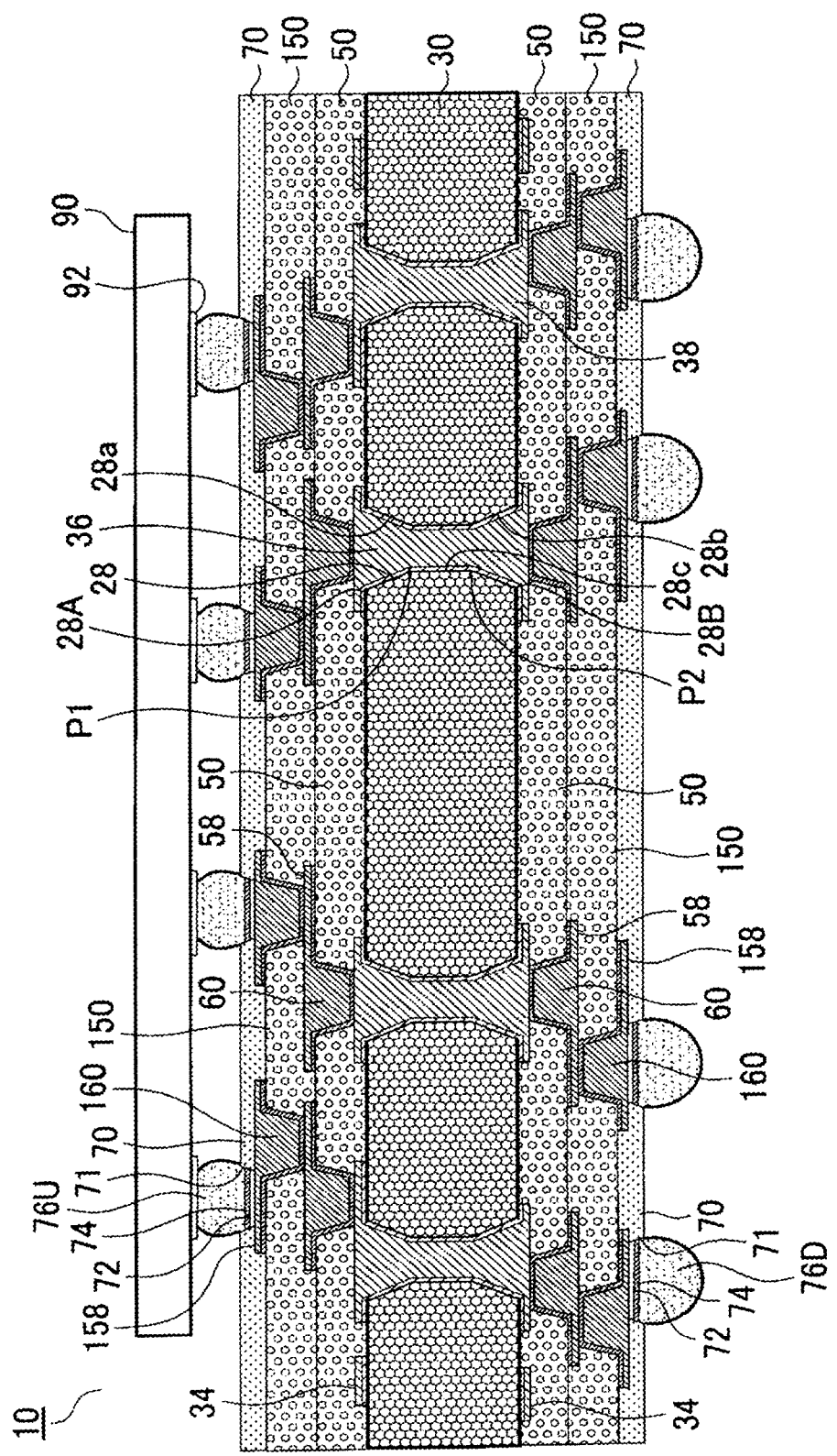
FIG. 7 is a cross-sectional view of a state where an IC chip is mounted on the multilayer printed wiring board shown in FIG. 6.

A multilayer printed wiring board according to a first example of the present invention is described with reference to the cross-sectional views in FIGS. 6 and 7. FIG. 6 shows multilayer printed wiring board 10 prior to mounting an IC chip. FIG. 7 shows a state in which IC chip 90 is mounted on multilayer printed wiring board 10 shown in FIG. 6. IC chip 90 is mounted on multilayer printed wiring board 10 by connecting solder bump (76U) with pad 92 of IC chip 90. Multilayer printed wiring board 10 is formed by building up interlayer insulation layers (50, 150) and conductive circuits (58, 158) on both surfaces of core substrate 30 through lamination.

In multilayer printed wiring board 10 according to the first example, conductive circuits 34 are formed on surfaces of core substrate 30. Conductive circuit 34 on a first surface (upper surface) of core substrate 30 is connected to conductive circuit 34 on a second surface (lower surface) by through-hole conductor 36. Through-hole conductor 36 is formed by filling copper plating in penetrating hole 28 formed in the core substrate. Penetrating hole 28 is made up of first opening portion (28a) having first opening (28A) on the first surface (upper surface), second opening portion (28b) having second opening (28B) on the second surface (lower surface), and third opening portion (28c) formed using a laser to enlarge the juncture of first opening portion (28a) and second opening portion (28b). First opening portion (28a) tapers from the first surface toward the second surface, while second opening portion (28b) tapers from the second surface toward the first surface. First opening portion (28a) and second opening portion (28b) are connected in the core substrate by third opening portion (28c) whose diameter is substantially constant in a thickness direction of the core substrate. Through-hole conductor 36 is formed by filling penetrating hole 28 with plating.

On first surface (F) of core substrate 30, interlayer insulation layer 50 is formed where via conductor 60 and conductive circuit 58 are formed, and interlayer insulation layer 150 is formed where via conductor 160 and conductive circuit 158 are formed. Solder-resist layer 70 is formed on via conductor 160 and conductive circuit 158. In the central part of the first surface, solder bumps (76U) are formed on via conductor 160 and conductive circuit 158 through opening portions 71 of solder-resist layer 70. Solder bumps (76D) are formed on the second surface.

In the first example, stress generated in through-hole conductor 36 is dispersed to the following two locations: boundary (P1) between third opening portion (28c) having a substantially constant diameter in a thickness direction and tapered first opening portion (28a); and boundary (P2) between third opening portion (28c) having a substantially constant diameter in a thickness direction and second opening portion (28b). Thus, cracking seldom occurs. Moreover, since the generated stress is dispersed in boundaries (P1) and (P2), stress exerted on both ends of the through-hole conductor, where the through-hole conductor makes contact with first opening (28A) and second opening (28B), is reduced. Accordingly, peeling is less likely to occur between through-hole conductor 36 and via conductor 60 directly on the through-hole conductor, thus enhancing reliability.

By referring to FIGS. 1-6, the following is a description of a method for manufacturing multilayer printed wiring board 10 described above with reference to FIGS. 6 and 7.

(1) Copper-clad laminate (20A) is prepared as a starting material, where 15 μm-thick copper foil 22 is laminated on both surfaces of core substrate 30 made of 0.15 mm-thick glass-epoxy resin or BT (bismaleimide triazine) resin. The thickness of the resin substrate is preferred to be in the range of 0.05 mm to 0.30 mm. If it is thinner than 0.05 mm, the substrate strength is too low. If the thickness exceeds 0.30 mm, it is difficult to form by a laser a tapered penetrating hole for a through-hole conductor. First, a black-oxide treatment is conducted on the surface of copper foil 22 using a solution containing NaOH (10 g/L), NaClO2 (40 g/L) and Na3PO4 (6 g/L) as a blackening bath (oxidation bath) (FIG. 1(A)).

(2) A CO2 laser is irradiated on the first-surface (F) (upper surface) side of core substrate 30 from the first surface toward the second surface, and first opening portion (28a) to form a penetrating hole for a through hole is formed on the first-surface (F) (upper surface) side of core substrate 30 (FIG. 1(B)). The number of shots at that time is one. Here, first opening portion (28a) has first opening (28A) on the first surface (upper surface), and tapers from first opening (28A) toward second surface (lower surface) (S).

(3) A CO2 laser is irradiated on the second-surface (S) (lower surface) side of core substrate 30 from the second surface toward the first surface under the same conditions for forming first opening portion (28a), and second opening portion (28b) is formed to be connected to first opening portion (28a) (FIG. 1(C)). The number of shots at that time is one. Here, second opening portion (28b) has second opening (28B) on the second surface (lower surface), and tapers from second opening (28B) toward first surface (upper surface) (F).

(4) A CO2 laser is irradiated from the second surface toward the first surface at the juncture of second opening portion (28b) and first opening portion (28a) on the second-surface (S) (lower surface) side of core substrate 30. Third opening portion (28c) is formed to enlarge the juncture of first opening portion (28a) and second opening portion (28b) (FIG. 1(D)). The number of shots at that time is one. Third opening portion (28c) is formed to have a substantially constant diameter in a thickness direction of the core substrate, or to taper slightly. Here, the minimum diameter of penetrating hole 28 is the diameter of third opening portion (28c). When irradiating a CO2 laser for forming third opening portion (28c), the CO2 laser may be irradiated from the first surface toward the second surface at the juncture of first opening portion (28a) and second opening portion (28b) on the first-surface (upper surface) (F) side of the core substrate. The number of shots at that time is one. Here, when forming third opening portion (28c), by using the same CO2 irradiation apparatus as that for forming second opening portion (28b), positional accuracy with second opening portion (28b) is enhanced and the connection reliability of the through-hole conductor is improved.

Figure 8:
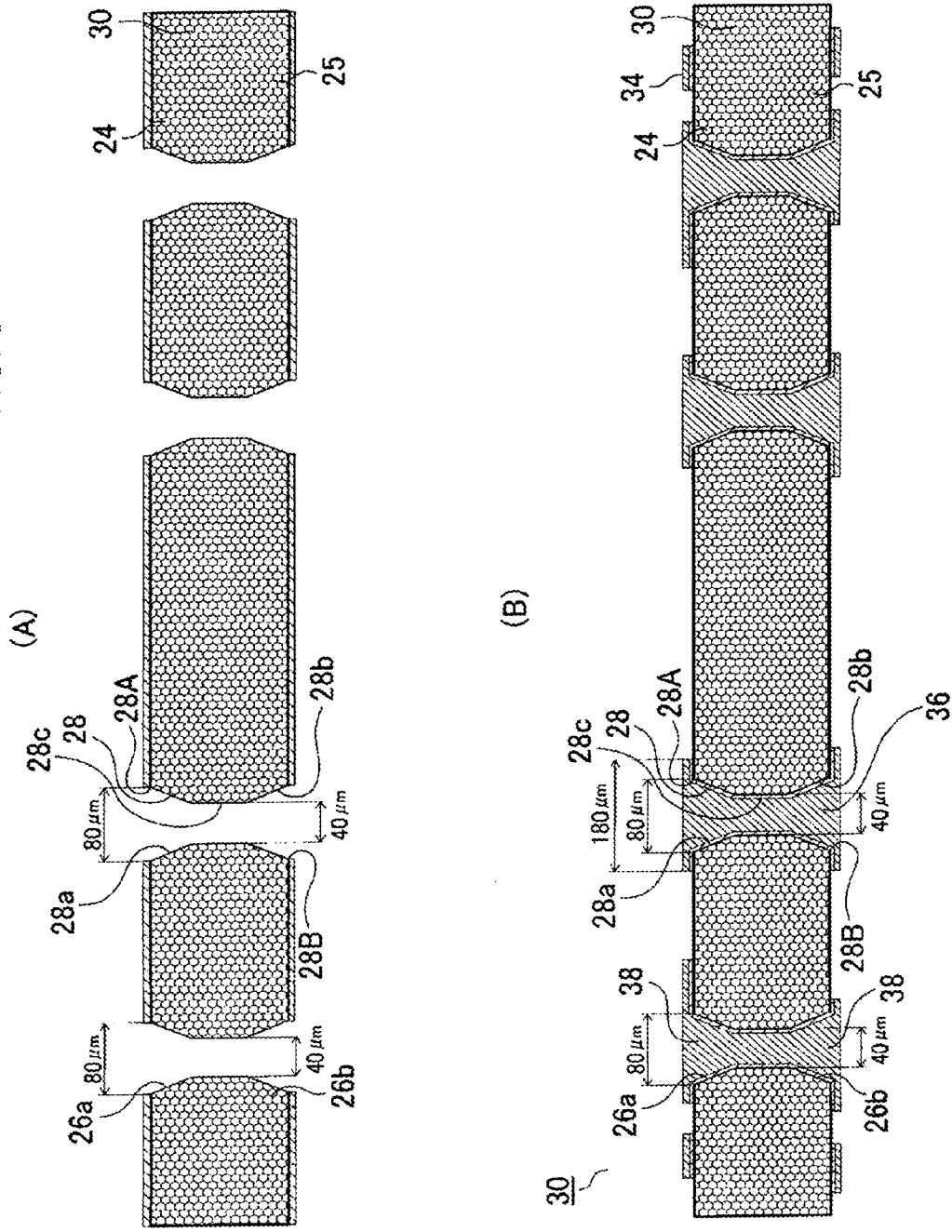
FIG. 8(A) is a cross-sectional view of a core substrate having penetrating holes.
FIG. 8(B) is a cross-sectional view of the core substrate having through-hole conductors.
Figure 9:
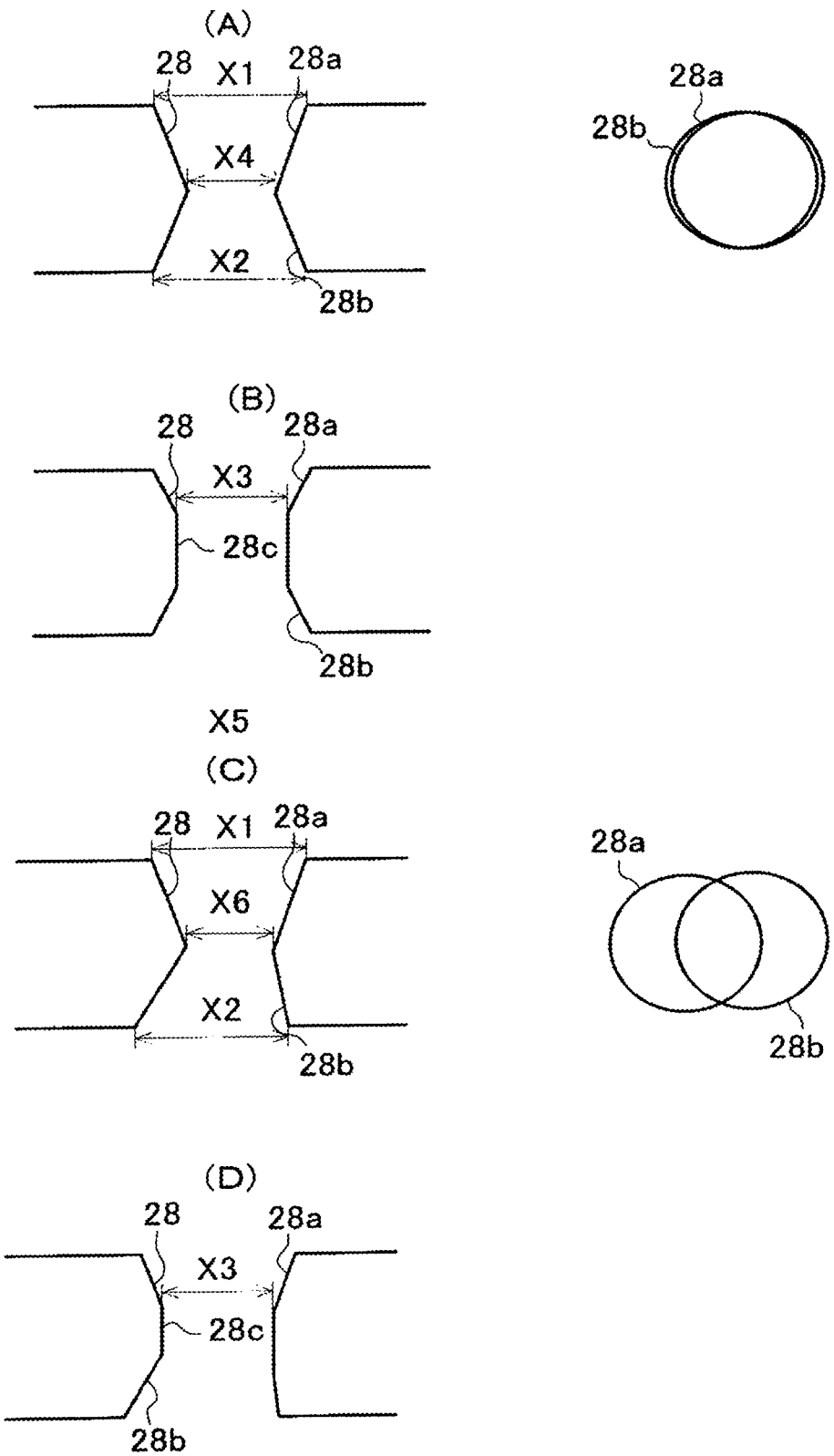
FIGS. 9(A)-9(D) are views to illustrate penetrating holes according to the first example.
Figure 10:
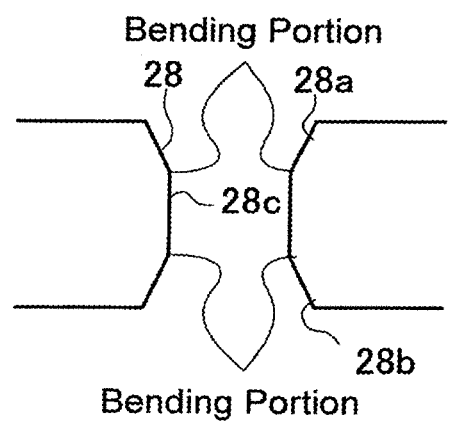
FIG. 10 is a view to illustrate a penetrating hole according to the first example.

FIG. 8(A) is a magnified view of core substrate 30 where penetrating hole 28 is formed. FIG. 9(A) shows a cross-sectional view of a penetrating hole before third opening portion (28c) is formed. FIG. 9(B) and FIG. 10 show cross-sectional views of the penetrating hole after third opening portion (28c) has been formed. The minimum diameter of penetrating hole 28 for a through hole is enlarged from (X4) to (X3) by third opening portion (28c).

Regarding one of the laser conditions, the aperture opening diameters are set the same when forming first opening portion (28a) and second opening portion (28b). On the other hand, the aperture opening diameter for forming third opening portion (28c) is preferred to be set smaller than the aperture opening diameters for forming first opening portion (28a) and second opening portion (28b). By reducing the aperture opening diameter, the shape of the penetrating hole is maintained to have tapered first opening portion (28a) and second opening portion (28b), since first opening portion (28a) and second opening portion (28b) are already connected at their juncture. At that time, the size of the aperture opening diameter for forming third opening portion (28c) determines the diameter of the third opening portion, and further determines the depth of the third opening portion (see FIG. 11).

Regarding one of the laser conditions, the pulse widths may be set the same or differently when forming first opening portion (28a) and second opening portion (28b). If the centers of first opening (28A) and second opening (28B) are not shifted from each other while sandwiching core substrate 30 in-between, and their pulse widths are set the same when forming first opening portion (28a) and second opening portion (28b), the depth of first opening portion (28a) is the same as that of second opening portion (28b); and the value of (Xa) is the same as that of (Xb) in FIG. 11. On the other hand, if the centers of first opening (28A) and second opening (28B) are not shifted from each other while sandwiching core substrate 30 in-between, and their pulse widths are set differently when forming first opening portion (28a) and second opening portion (28b), the depth of first opening portion (28a) is different from that of second opening portion (28*b*); and the value of (Xa) is different from that of (Xb).

Among the laser conditions for forming third opening portion (28*c*), the pulse width is preferred to be the same as or shorter than that for forming first opening portion (28*a*) and second opening portion (28*b*). Since first opening portion (28*a*) and second opening portion (28*b*) are already connected at their juncture, the pulse width for forming third opening portion (28*c*) is set shorter. If the aperture opening diameter for forming third opening portion (28*c*) is smaller than the aperture opening diameters for forming first opening portion (28*a*) and second opening portion (28*b*), the pulse width for forming third opening portion (28*c*) may be the same pulse width as the conditions for forming first opening portion (28*a*) and second opening portion (28*b*). The opening diameter, the diameter and the depth of an opening portion for first opening portion (28*a*), second opening portion (28*b*) and third opening portion (28*c*) may be determined respectively by adjusting the laser pulse width and the aperture diameter.

The right parts of FIG. 9(A) (C) are projected views of the following with the core substrate sandwiched in between: the position of first opening (28A), formed by irradiating a CO2 laser at the first-surface (upper surface) (F) side of core substrate 30 from the first surface toward the second surface; and the position of second opening (28B), formed by irradiating a laser at the second-surface (lower surface) (S) side of core substrate 30 from the second surface toward the first surface. When the opening positions of first opening (28A) and second opening (28B) overlap, penetrating hole 28 where first opening portion (28*a*) is directly connected to second opening portion (28*b*) has its minimum diameter (X4) (FIG. 9(A)). On the other hand, if the opening positions of first opening (28A) and second opening (28B) are shifted from each other, penetrating hole 28 where first opening portion (28*a*) is directly connected to second opening portion (28*b*) has its minimum diameter (X6) (FIG. 9(C)). When the opening positions of first opening (28A) and second opening (28B) are shifted from each other, (X6) is smaller than (X4), as obviously seen from comparing FIGS. 9(A) and (C), and thus it is difficult to fill the penetrating hole with plating. However, in the first example, even if the circle of first opening (28A) is shifted from the opening of second opening (28B), the minimum diameter of penetrating hole 28 for a through hole corresponds to diameter (X3) of third opening portion (28*c*), which is greater than minimum diameter (X6). Accordingly, the penetrating hole is securely filled with plating.

Figure 11:
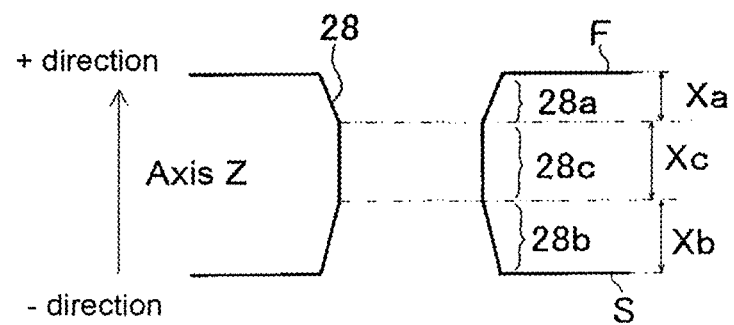
FIG. 11 is a view to illustrate the depth of a penetrating hole.

FIG. 11 shows depth (thickness) (Xa) of first opening portion (28*a*) of penetrating hole 28, depth (thickness) (Xc) of third opening portion (28*c*), and depth (thickness) (Xb) of second opening portion (28*b*). Depth (thickness) (Xa) of first opening portion (28*a*) may be different from depth (thickness) (Xb) of second opening portion (28*b*). Also, depth (thickness) (Xc) of third opening portion (28*c*) may be different from depth (thickness) (Xa) of first opening portion (28*a*) or depth (thickness) (Xb) of second opening portion (28*b*). Also, as shown in FIG. 9(C), a straight line passing through the gravity center of first opening (28A) and perpendicular to first surface (F) of core substrate 30 may be offset from a straight line passing through the gravity center of second opening (28B) and perpendicular to first surface (F) of core substrate 30. As shown in FIGS. 9(C) and (D), since third opening portion (28*c*) is formed by irradiating a CO2 laser, a sufficient opening is obtained. Planes, respectively passing through boundary (P1) between third opening portion (28*c*) having a substantially constant diameter in a thickness direction and tapered first opening portion (28*a*) and boundary (P2) between second opening portion (28*b*) and third opening portion (28*c*), are not parallel to the first surface and the second surface of core substrate 30. Therefore, stress generated at the boundary of the through-hole conductor and the insulation layer is dispersed. Accordingly, cracking seldom occurs and reliability is enhanced.

(5) After a desmearing treatment is conducted on penetrating hole 28 using permanganic acid, electroless plating is performed to form electroless plated film 31 (FIG. 2(A)).

(6) Plating resist 40 with a predetermined pattern is formed on electroless plated film 31 on surfaces of core substrate 30 (FIG. 2(B)).

(7) Electrolytic plating is performed to form electrolytic plated film 32 where plating resist 40 is not formed. Penetrating hole 28 is filled with plating and through-hole conductor 36 is formed (FIG. 2(C)). In the first example, the diameter of penetrating hole 28 for a through-hole conductor is greater at first opening (28A) and second opening (28B) (ends), and smaller at the center of the core substrate. Therefore, when penetrating hole 28 is filled with plating, voids or the like seldom remain in such plating and the reliability of the through-hole conductor is enhanced.

(8) Plating resist 40 is removed, and electroless plated film 31 and copper foil 22 under the plating resist are etched away. Conductive circuits 34 and through-hole conductor 36 are formed and core substrate 30 is completed (FIG. 3(A)).

(9) On both surfaces of core substrate 30 after the above procedure, 50 μm-thick resin film for interlayer insulation layers with a slightly greater size is pressure-laminated under vacuum conditions while the temperature is increased. Accordingly, interlayer insulation layers 50 are formed (see FIG. 3(B)).

(10) Next, via-hole opening portions 51 with a diameter of 80 μm are formed in interlayer insulation layers 50 using a CO2 gas laser (see FIG. 3(C)). By immersing the substrate in an oxidation agent such as chromic acid and permanganate, surfaces of interlayer insulation layers 50 are roughened (not shown in the drawings).

(11) A catalyst such as palladium is applied in advance to surface layers of interlayer insulation layers 50, and the substrate is immersed in an electroless plating solution for 5-6 minutes. Electroless plated film 52 is formed in a range of 0.1~5 μm (FIG. 3(D)).

(12) A commercially available photosensitive dry film is laminated on substrate 30 after the above treatment, exposed to light with a photomask film placed thereon and developed using sodium carbonate. Accordingly, 15 μm-thick plating resist 54 is formed (FIG. 4(A)).

(13) Next, electrolytic plating is performed to form 15 μm-thick electrolytic plated film 56 (see FIG. 4(B)).

(14) After plating resist 54 is removed by 5% NaOH, electroless plated film 52 under the plating resist is dissolved and removed by etching using a mixed solution of nitric acid, sulfuric acid and hydrogen peroxide. Conductive circuits 58 with a thickness of 15 μm and via conductors 60 made of electroless plated film 52 and electrolytic plated film 56 are formed (FIG. 4(C)). Surfaces of conductive circuits 58 and via conductors 60 are roughened by an etching solution containing copper (II) complex and organic acid (not shown in the drawings).

(15) Through the same procedures as in above (9)~(14), interlayer insulation layers 150 having conductive circuits 158 and via conductors 160 are formed (FIG. 5(A)).

(16) A commercially available solder-resist composition is applied, exposed to light and developed to form solder-resist layers 70 having opening portions 71 (FIG. 5(B)).

(17) The substrate is immersed in an electroless nickel plating solution to form 5 μm-thick nickel-plated layer 72 in opening portions 71. In addition, the substrate is immersed in an electroless gold-plating solution to form 0.03 μm-thick gold-plated layer 74 on nickel-plated layer 72 (FIG. 5(C)). Instead of nickel-gold layers, nickel-palladium-gold layers may also be formed.

(18) Next, solder balls are loaded in opening portions 71 and a reflow is conducted. Accordingly, solder bump (76U) is formed on the first-surface (upper-surface) side, solder bump (76D) is formed on the second-surface (lower-surface) side, and multilayer printed wiring board 10 is completed (FIG. 6).

IC chip 90 is mounted on printed wiring board 10 by connecting pad 92 of IC chip 90 with solder bump (76U) (FIG. 7).

In the first example, after penetrating hole 28 for a through hole is formed with tapered first opening portion (28*a*) and tapered second opening portion (28*b*), a CO2 laser is further irradiated at the juncture of first opening portion (28*a*) and second opening portion (28*b*) so that the diameter is enlarged. Therefore, if opening positions of first opening (28A) and second opening (28B) are shifted from each other while sandwiching the core substrate in-between, highly reliable penetrating hole 28 is formed. Also, since plating solutions circulate smoothly, it is easy to fill plating in penetrating hole 28. Accordingly, voids or the like seldom remain and the reliability of the through-hole conductor is enhanced.

SECOND EXAMPLE

Figure 12:
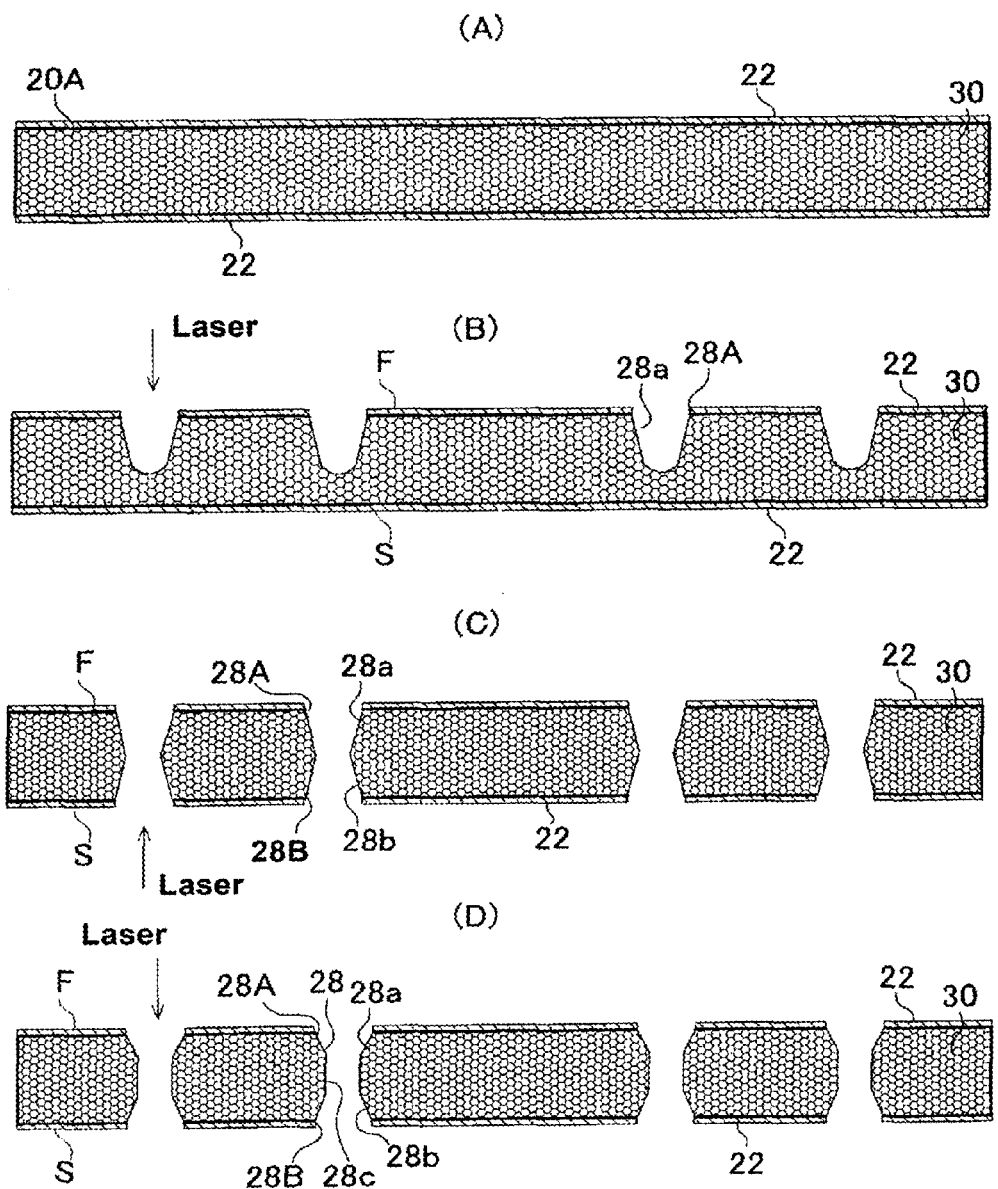
FIGS. 12(A)-12(D) are views of steps showing a method for manufacturing a multilayer printed wiring board according to a second example.

A multilayer printed wiring board according to a second example of the present invention is described with reference to FIG. 12. In the above-described first example, after a laser is irradiated from the second-surface (lower surface) (S) side of the core substrate to form second opening portion (28*b*) to be contiguous to the first opening, the laser is irradiated from the second-surface (lower surface) (S) side to form juncture (28*c*) which connects first opening portion (28*a*) and second opening portion (28*b*).

By contrast, in the second example, a laser is irradiated from the second-surface (lower surface) (S) side of the core substrate under the same conditions for the first opening portion to form second opening portion (28*b*) to be contiguous to the first opening portion (FIG. 12(C)). Then, a laser is irradiated from the first-surface (upper surface) (F) side to form juncture (28*c*) which connects first opening portion (28*a*) and second opening portion (28*b*) (FIG. 12(D)). Third opening portion (28*c*) is formed to have a substantially constant diameter or to taper slightly.

A method for manufacturing a printed wiring board according to an embodiment of the present invention has the following features: preparing a core substrate having a first surface and a second surface opposite the first surface; on the first-surface side of the core substrate, forming a first opening portion that gradually becomes narrower from the first surface toward the second surface; on the second-surface side of the core substrate, forming a second opening portion that gradually becomes narrower from the second surface toward the first surface and is connected to the first opening portion; by enlarging the juncture of the first opening portion and the second opening portion, forming a penetrating hole in the core substrate; forming a first conductor on the first surface of the core substrate; forming a second conductor on the second surface of the core substrate; and by filling conductive material in the penetrating hole, forming a through-hole conductor that connects the first conductor and the second conductor.

According to an embodiment of the present invention, even if laser processing accuracy is low and the juncture is small between the first and second opening portions for forming a through hole, by forming a third opening portion, a through-hole conductor is formed where thermal stress is less likely to be concentrated.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   preparing a core substrate having a first surface and a second surface on an opposite side of the first surface;
   forming on a first-surface side of the core substrate a first opening portion tapering from the first surface toward the second surface;
   forming on a second-surface side of the core substrate a second opening portion tapering from the second surface toward the first surface;
   forming a third opening portion such that a penetrating hole comprising the first opening portion, the second opening portion and the third opening portion connecting the first opening portion and the second opening portion is formed in the core substrate;
   forming a first conductor on the first surface of the core substrate;
   forming a second conductor on the second surface of the core substrate; and
   filling a conductive material in the penetrating hole such that a through-hole conductor connecting the first conductor and the second conductor is formed through the core substrate.

2. The method for manufacturing a printed wiring board according to claim 1, wherein the forming of the second opening portion comprises forming on the second-surface side of the core substrate the second opening portion tapering from the second surface toward the first surface such that the second opening portion is connected to the first opening portion, and the forming of the third opening portion comprises enlarging a juncture of the first opening portion and the second opening portion such that the penetrating hole comprising the first opening portion, the second opening portion and the third opening portion connecting the first opening portion and the second opening portion is formed in the core substrate.

3. The method for manufacturing a multilayer printed wiring board according to claim 2, wherein the enlarging of the juncture includes irradiating laser at the juncture from the first-surface side of the core substrate.

4. The method for manufacturing a multilayer printed wiring board according to claim 2, wherein the enlarging of the juncture includes irradiating laser at the juncture from the second-surface side of the core substrate.

5. The method for manufacturing a multilayer printed wiring board according to claim 2, wherein the enlarging of the juncture includes irradiating laser at the juncture.

6. The method for manufacturing a multilayer printed wiring board according to claim 2, wherein the forming of the first opening portion comprises irradiating laser based on an aperture opening diameter for forming the first opening portion on the first surface of the core substrate, the forming of the second opening portion comprises irradiating laser based on an aperture opening diameter for forming the second opening portion on the second surface of the core substrate, and the aperture opening diameters for forming the first opening portion and the second opening portion are the same.

7. The method for manufacturing a multilayer printed wiring board according to claim 2, wherein the forming of the first opening portion comprises irradiating laser based on an aperture opening diameter for forming the first opening portion on the first surface of the core substrate, the forming of the second opening portion comprises irradiating laser based on an aperture opening diameter for forming the second opening portion on the second surface of the core substrate, the enlarging of the juncture includes irradiating laser based on an aperture opening diameter for forming the third opening portion at the juncture, and the aperture opening diameter for forming the third opening portion is set smaller than the aperture opening diameters for forming the first opening portion and the second opening portion.

8. The method for manufacturing a multilayer printed wiring board according to claim 2, wherein the forming of the first opening portion comprises irradiating laser based on a laser pulse width for forming the first opening portion on the first surface of the core substrate, the forming of the second opening portion comprises irradiating laser based on a laser pulse width for forming the first opening portion for forming the second opening portion on the second surface of the core substrate, the enlarging of the juncture includes irradiating laser based on a laser pulse width for enlarging the juncture at the juncture, and the laser pulse width for enlarging the juncture is set smaller than the laser pulse widths for forming the first opening portion and the second opening portion.

9. The method for manufacturing a multilayer printed wiring board according to claim 2, wherein the core substrate comprises a resin substrate and a first copper foil laminated on one side of the resin substrate and a second copper foil laminated on an opposite side of the resin substrate, and the resin substrate has a thickness which is in a range of 0.05 mm~0.2 mm.

10. The method for manufacturing a multilayer printed wiring board according to claim 2, wherein the first opening portion and the second opening portion have different depths with respect to a thickness direction of the core substrate.

11. The method for manufacturing a multilayer printed wiring board according to claim 10, wherein the third opening portion has a depth which is different from depths of the first opening portion and the second opening portion with respect to a thickness direction of the core substrate.

12. The method for manufacturing a multilayer printed wiring board according to claim 2, wherein the forming of the first opening portion and the forming of the second opening portion include setting a straight line passing through a gravity center of the first opening portion and perpendicular to the first surface or the second surface of the core substrate off from a straight line passing through a gravity center of the second opening portion and perpendicular to the first surface or the second surface of the core substrate such that the straight line passing through the gravity center of the first opening portion is not in alignment with the straight line passing through the gravity center of the second opening portion.

13. The method for manufacturing a multilayer printed wiring board according to claim 2, further comprising forming a buildup structure comprising an interlayer insulation layer and a conductive layer on one of the first-surface side and the second-surface side of the core substrate.

14. The method for manufacturing a multilayer printed wiring board according to claim 2, further comprising:
    forming a buildup structure comprising an interlayer insulation layer and a conductive layer on one of the first-surface side and the second-surface side of the core substrate; and
    mounting an electronic component on a surface of the buildup structure.

15. The method for manufacturing a multilayer printed wiring board according to claim 2, wherein the filling of the conductive material comprises filling the penetrating hole with a plating material such that the penetrating hole is closed by the plating material.

16. The method for manufacturing a multilayer printed wiring board according to claim 2, further comprising:
    forming a first buildup structure comprising an interlayer insulation layer and a conductive layer on the first-surface side of the core substrate; and
    forming a second buildup structure comprising an interlayer insulation layer and a conductive layer on the second-surface side of the core substrate.

17. The method for manufacturing a multilayer printed wiring board according to claim 2, further comprising:
    forming a first buildup structure comprising an interlayer insulation layer and a conductive layer on the first-surface side of the core substrate;
    forming a second buildup structure comprising an interlayer insulation layer and a conductive layer on the second-surface side of the core substrate; and
    mounting an electronic component on a surface of one of the first buildup structure and the second buildup structure.

18. The method for manufacturing a multilayer printed wiring board according to claim 2, wherein the filling of the conductive material comprises electrolytically plating an interior space of the penetrating hole such that the penetrating hole is closed by an electrolytic plating material.

19. The method for manufacturing a multilayer printed wiring board according to claim 2, wherein the enlarging of the juncture comprises forming the third opening portion having a substantially constant diameter.

20. The method for manufacturing a multilayer printed wiring board according to claim 1, wherein the forming of the third opening portion comprises forming a juncture of the first opening portion and the second opening portion such that a penetrating hole comprising the first opening portion, the second opening portion and the third opening portion connecting the first opening portion and the second opening portion is formed in the core substrate.

* * * * *